US009532401B2

(12) United States Patent
Cong et al.

(10) Patent No.: US 9,532,401 B2
(45) **Date of Patent: *Dec. 27, 2016**

(54) SUSCEPTOR SUPPORT SHAFT WITH UNIFORMITY TUNING LENSES FOR EPI PROCESS

(71) Applicant: Applied Materials, Inc., Santa Clara, CA (US)

(72) Inventors: Zhepeng Cong, Vancouver, WA (US); Balasubramanian Ramachandran, Santa Clara, CA (US); Masato Ishii, Sunnyvale, CA (US); Xuebin Li, Santa Clara, CA (US); Mehmet Tugrul Samir, Mountain View, CA (US); Shu-Kwan Lau, Sunnyvale, CA (US); Paul Brillhart, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 330 days.

This patent is subject to a terminal disclaimer.

(21) Appl. No.: 14/181,035

(22) Filed: Feb. 14, 2014

(65) Prior Publication Data

US 2014/0263268 A1 Sep. 18, 2014

Related U.S. Application Data

(60) Provisional application No. 61/798,503, filed on Mar. 15, 2013.

(51) Int. Cl.
*F27D 5/00* (2006.01)
*C23C 14/00* (2006.01)
(Continued)

(52) U.S. Cl.
CPC ....... *H05B 1/0227* (2013.01); *H05B 2203/032* (2013.01)

(58) Field of Classification Search
CPC ........................ H05B 1/0227; H05B 2203/032
(Continued)

(56) References Cited

U.S. PATENT DOCUMENTS 4,639,139 A 1/1987 Wyant et al.
5,044,943 A 9/1991 Bowman et al.
(Continued)

FOREIGN PATENT DOCUMENTS

KR 10-2010-0047204 5/2010

OTHER PUBLICATIONS

International Search Report & Written Opinion dated May 7, 2014 for Application No. PCT/US2014/016608.
Dffice Action for U.S Appl. No. 14/182,634 dated Feb. 27, 2015.

*Primary Examiner* — Dana Ross
*Assistant Examiner* — Ket D Dang
(74) *Attorney, Agent, or Firm* — Patterson & Sheridan, LLP

(57) ABSTRACT

Embodiments of the invention generally relate to susceptor support shafts and process chambers containing the same. A susceptor support shaft supports a susceptor thereon, which in turn, supports a substrate during processing. The susceptor support shaft reduces variations in temperature measurement of the susceptor and/or substrate by providing a consistent path for a pyrometer focal beam directed towards the susceptor and/or substrate, even when the susceptor support shaft is rotated. The susceptor support shafts also have a relatively low thermal mass which increases the ramp up and ramp down rates of a process chamber. In some embodiments, a custom made refractive element can be removably placed on the top of the solid disc to redistribute secondary heat distributions across the susceptor and/or substrate for optimum thickness uniformity of epitaxy process.

17 Claims, 5 Drawing Sheets

(51) Int. Cl.
*H01L 21/302* (2006.01)
*H05B 1/02* (2006.01)

(58) Field of Classification Search
USPC ............. 118/500, 728, 50, 730, 52, 715, 58, 729,118/666, 641, 696, 69, 319, 320; 156/345.51, 156/345.52, 345.55; 427/70, 72, 240, 425; 414/935, 936, 941; 219/392, 443.1; 29/525.01, 428; 438/710, 708, 714, 727, 438/730
See application file for complete search history.

(56) References Cited

U.S. PATENT DOCUMENTS

| | | | | |
|---|---|---|---|---|
| 5,318,634 | A * | 6/1994 | deBoer | B05C 11/08 118/52 |
| 5,421,893 | A * | 6/1995 | Perlov | H01L 21/67115 118/725 |
| 5,695,566 | A * | 12/1997 | Suzuki | C23C 14/50 118/723 E |
| 6,021,152 | A * | 2/2000 | Olsen | C23C 14/12 118/620 |
| 6,187,159 | B1 * | 2/2001 | Kamura | C23C 14/50 118/728 |
| 6,301,434 | B1 | 10/2001 | McDiarmid et al. | |
| 6,315,833 | B1 * | 11/2001 | Callaghan | H01L 21/67748 118/500 |
| 6,399,510 | B1 * | 6/2002 | Riley | C23C 16/455 156/345.1 |
| 6,538,809 | B1 | 3/2003 | Stankewitz | |
| 6,893,507 | B2 | 5/2005 | Goodman et al. | |
| 7,214,271 | B2 * | 5/2007 | Kono | C23C 16/4581 117/223 |
| 7,232,591 | B2 * | 6/2007 | Okumura | C03C 17/23 118/728 |
| 7,393,417 | B1 * | 7/2008 | Maeda | C23C 16/4583 118/725 |
| 7,654,221 | B2 * | 2/2010 | Lubomirsky | C23C 18/1619 118/319 |
| 8,372,196 | B2 | 2/2013 | Nakamura et al. | |
| 8,591,700 | B2 * | 11/2013 | Gatchalian | B05C 13/02 118/500 |
| 9,123,765 | B2 * | 9/2015 | Samir | H01L 21/68792 |
| 2006/0005770 | A1 * | 1/2006 | Tiner | H01L 21/68742 118/728 |
| 2009/0031954 | A1 * | 2/2009 | Nishikido | C23C 16/4581 118/725 |
| 2011/0121503 | A1 * | 5/2011 | Burrows | C23C 16/4412 269/289 R |
| 2011/0155058 | A1 * | 6/2011 | Carlson | C23C 16/46 118/722 |
| 2011/0174212 | A1 * | 7/2011 | Ramachandran | C23C 16/455 117/98 |
| 2012/0234243 | A1 | 9/2012 | Olgado et al. | |
| 2012/0266819 | A1 * | 10/2012 | Sanchez | C23C 16/4412 118/719 |
| 2012/0285382 | A1 * | 11/2012 | Shimizu | C30B 25/12 118/728 |
| 2012/0305717 | A1 * | 12/2012 | Dye | F16L 59/065 248/176.1 |

* cited by examiner

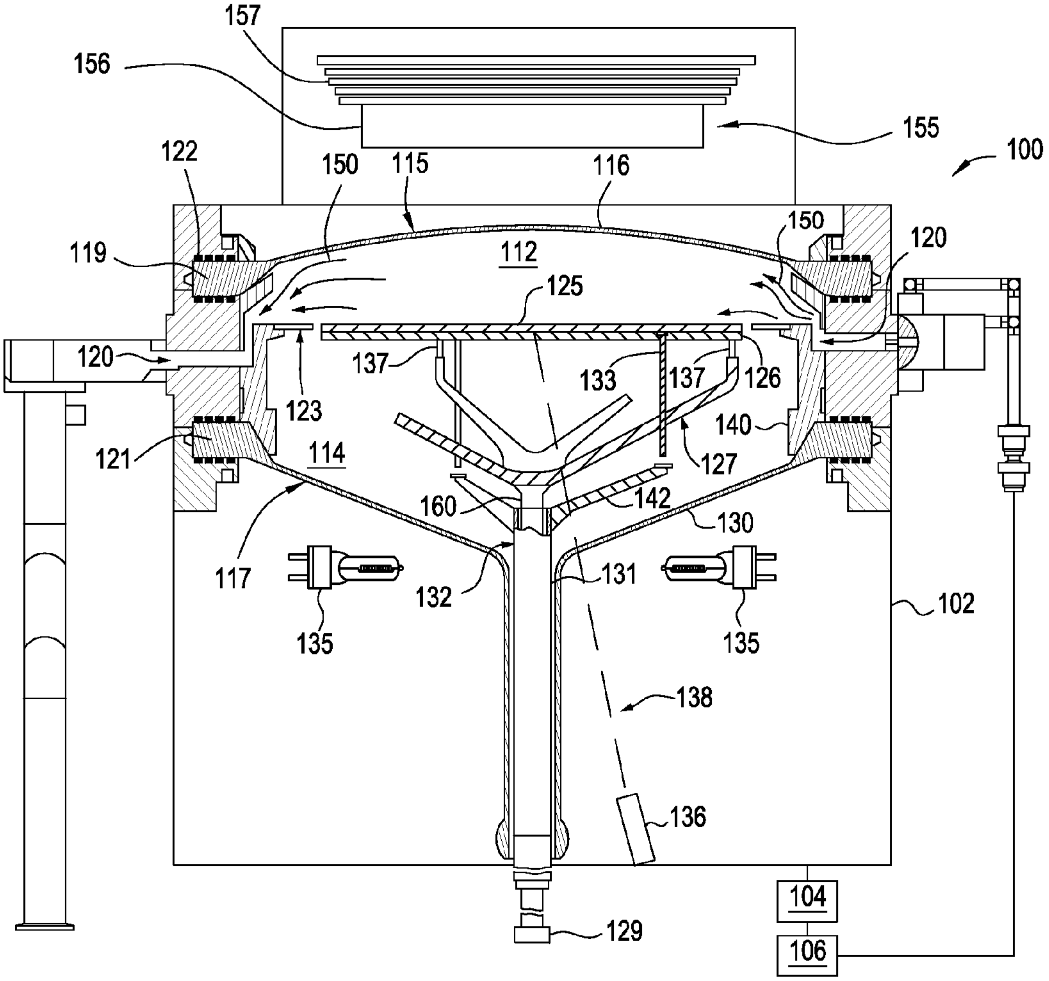
FIG. 1B
FIG. 1C
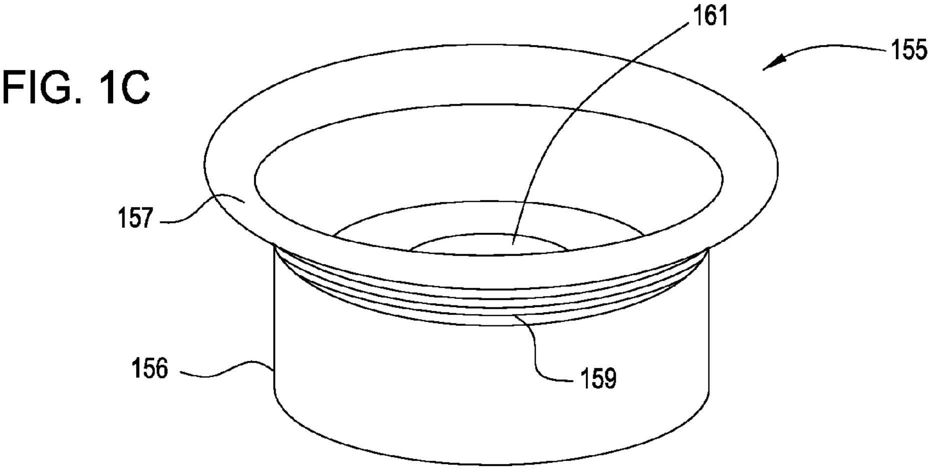

SUSCEPTOR SUPPORT SHAFT WITH UNIFORMITY TUNING LENSES FOR EPI PROCESS

CROSS-REFERENCE TO RELATED APPLICATIONS

This application claims benefit of U.S. provisional patent application Ser. No. 61/798,503, filed Mar. 15, 2013 which is herein incorporated by reference.

BACKGROUND

Field

Embodiments of the present invention generally relate to supporting substrates in processing chambers.

Description of the Related Art

During processing, substrates are positioned on a susceptor within a process chamber. The susceptor is supported by a susceptor support shaft, which is rotatable about a central axis. The susceptor support shaft includes multiple arms extending therefrom—usually three to six—which support the susceptor. As the susceptor support shaft is rotated during processing, the arms extending from the susceptor support shaft interrupt a pyrometer beam used to measure a temperature of the susceptor or the substrate, thus causing the interference of pyrometer readings. Even though the arms may be formed from quartz, which is generally optically transparent, at least some amount of light is absorbed by the arms, and thus, is not completely optically transparent. This amount of light absorbed and scattered by the arms affects the amount of light transmitted by the pyrometer beam to the susceptor, and thus, affects the accuracy of the temperature measurement by the pyrometer. As the susceptor support shaft rotates, there are periods when the arm is within the pyrometer beam path, and periods when the arm is adjacent to the pyrometer beam path. Thus, the amount of light from the pyrometer beam reaching the susceptor varies as the susceptor support rotates, resulting in periods of inaccurate temperature measurement.

An IR pyrometry system is normally used for the sensing of radiation emitted from the backside of susceptor or a substrate, the pyrometer reading is then converted to temperature based on the surface emissivity of the susceptor or substrate. A software filter is normally used to reduce interference with temperature ripples (due to the support arms move in and out the pyrometer beam during the rotation mentioned above) to around ±1 degree Celsius. The software filter is also used with an algorithm including average data in sample window a couple of seconds wide.

With the advanced cyclic EPI process, the process temperature will change as per recipe step and recipe step time is getting shorter. Therefore, the time delay of the software filter needs to be minimized and a much narrower sample window is required to improve dynamic response of temperature variations. The temperature ripple needs to be further reduced to less than ±0.5 degree Celsius range for optimum cycle to cycle temperature repeatability.

Therefore, there is a need for an apparatus which enables more accurate temperature measurement.

SUMMARY OF THE INVENTION

Embodiments of the invention generally relate to susceptor support shafts and process chambers containing the same. A susceptor support shaft supports a susceptor thereon, which in turn, supports a substrate during processing. The susceptor support shaft reduces variations in temperature measurement of the susceptor and/or substrate by providing a consistent path for a pyrometer focal beam directed towards the susceptor and/or substrate, even when the susceptor support shaft is rotated. The susceptor support shafts also have a relatively low thermal mass which enables fast ramp up and ramp down rates of a susceptor in the process chamber.

In one embodiment, a susceptor support shaft for a process chamber comprises a cylindrical support shaft and a support body coupled the support shaft. The support body comprises a solid disc, a plurality of tapered bases extending from the solid disc, at least three support arms extending from some of the tapered bases, and at least three dummy arms extending from some of the tapered bases. In one example, a custom made refractive element may be removably placed on the top of the solid disc to redistribute secondary heat distributions across the susceptor and/or substrate.

In another embodiment, a process chamber for heating a substrate is disclosed. The process chamber comprises a susceptor disposed within the process chamber for supporting a substrate, a lower dome disposed below the substrate support, and an upper dome disposed opposing the lower dome. The upper dome comprises a central window portion and a peripheral flange engaging the central window portion around a circumference of the central window portion, wherein the central window portion and the peripheral flange are formed of an optically transparent material.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1B is a cross-sectional view of a thermal processing chamber according to another embodiment of the invention.

FIG. 1C is a perspective view of a reflector of FIG. 1B showing a top portion with threaded features running around a circumference of the top portion.

To facilitate understanding, identical reference numerals have been used, where possible, to designate identical elements that are common to the figures. It is contemplated that elements disclosed in one embodiment may be beneficially utilized in other embodiments without specific recitation.

DETAILED DESCRIPTION

Embodiments of the invention generally relate to susceptor support shafts and process chambers containing the same. A susceptor support shaft supports a susceptor thereon, which in turn, supports a substrate during processing. The susceptor support shaft is designed to reduce variations in temperature measurement of the susceptor and/or substrate by providing the susceptor support shaft with a solid disc near the rotation center covering the pyrometer sensing path directed towards the susceptor and/or substrate. As the solid disc covers the pyrometer temperature reading path, the pyrometer reading show less interference, even when the susceptor support shaft is rotated. The solid disc covers only the pyrometer focal beam near the rotation center, so the susceptor support shaft has a relatively low thermal mass, which enables fast ramp up and ramp down rates of a process chamber. In some embodiments, a custom made refractive element can be removably placed on the top of the solid disc to redistribute secondary heat distributions across the susceptor and/or substrate for optimum thickness uniformity of epitaxy process.

Embodiments disclosed herein may be practiced in the Applied CENTURA® RP EPI chamber, available from Applied Materials, Inc. of Santa Clara, Calif. It is contemplated that other chambers available from other manufacturers may also benefit from embodiments disclosed herein.

Figure 1A:
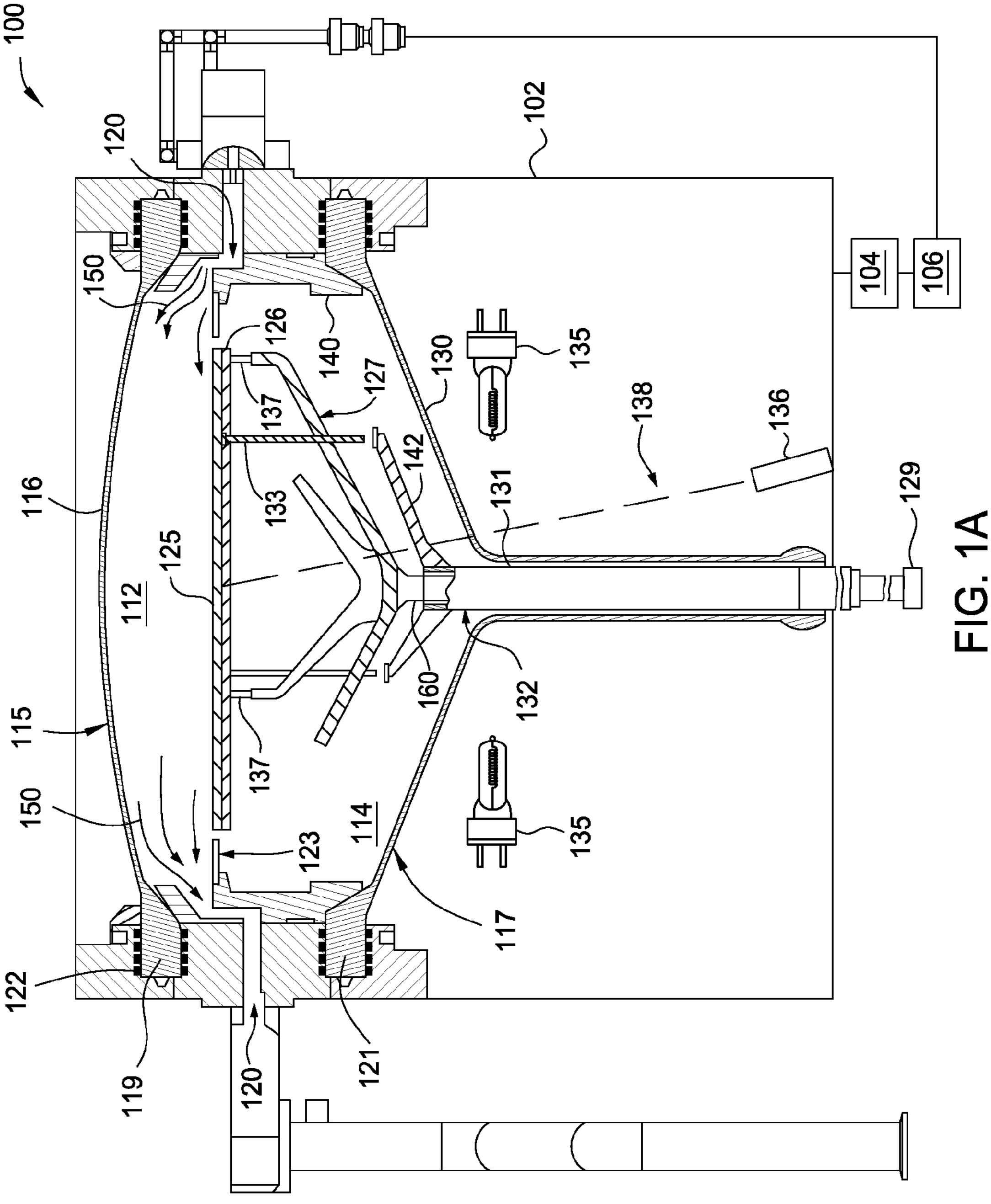
FIG. 1A illustrates a cross sectional view of a processing chamber according to an embodiment of the invention.

FIG. 1A is a cross-sectional view of a thermal processing chamber 100 according to an embodiment of the invention. The processing chamber 100 includes a chamber body 102, support systems 104, and a controller 106. The chamber body 102 includes an upper portion 112 and a lower portion 114. The upper portion 112 includes the area within the chamber body 102 between the upper dome 116 and the substrate 125. The lower portion 114 includes the area within the chamber body 102 between a lower dome 130 and the bottom of the substrate 125. Deposition processes generally occur on the upper surface of the substrate 125 within the upper portion 112.

The processing chamber 100 includes a plurality of heat sources, such as lamps 135, which are adapted to provide thermal energy to components positioned within the process chamber 100. For example, the lamps 135 may be adapted to provide thermal energy to the substrate 125, a susceptor 126, and/or the preheat ring 123. The lower dome 130 may be formed from an optically transparent material, such as quartz, to facilitate the passage of thermal radiation therethrough. In one embodiment, it is contemplated that lamps 135 may be positioned to provide thermal energy through the upper dome 116 as well as the lower dome 130.

The chamber body 102 includes a plurality of plenums 120 formed therein. For example, a first plenum 120 may be adapted to provide a process gas 150 therethrough into the upper portion 112 of the chamber body 102, while a second plenum 120 may be adapted to exhaust a process gas 150 from the upper portion 112. In such a manner, the process gas 150 may flow parallel to an upper surface of the substrate 125. Thermal decomposition of the process gas 150 onto the substrate 125 to form an epitaxial layer on the substrate 125 is facilitated by the lamps 135.

A substrate support assembly 132 is positioned in the lower portion 114 of the chamber body 102. The substrate support 132 is illustrated supporting a substrate 125 in a processing position. The substrate support assembly 132 includes a susceptor support shaft 127 formed from an optically transparent material and a susceptor 126 supported by the susceptor support shaft 127. A shaft 160 of the susceptor support shaft 127 is positioned within a shroud 131 to which lift pin contacts 142 are coupled. The susceptor support shaft 127 is rotatable. The shroud 131 is generally fixed in position, and therefore, does not rotate during processing.

Lift pins 133 are disposed through openings 280 (shown in FIG. 2) formed in the susceptor support shaft 127. The lift pins 133 are vertically actuatable and are adapted to contact the underside of the substrate 125 to lift the substrate 125 from a processing position (as shown) to a substrate removal position. The susceptor support shaft 127 is fabricated from quartz, while the susceptor 126 is fabricated from silicon carbide or graphite coated with silicon carbide.

The susceptor support shaft 127 is rotatable in order to facilitate the rotation of the substrate 125 during processing. Rotation of the susceptor support shaft 127 is facilitated by an actuator 129 coupled to the susceptor support shaft 127. Support pins 137 couple the susceptor support shaft 127 to the susceptor 126. In the embodiment FIG. 1A, three support pins 137 (two are shown) spaced 120 degrees apart are utilized to couple the susceptor support shaft 127 to the susceptor 126.

A pyrometer 136 is adapted to measure a temperature of the susceptor 126 and/or the substrate 125 by sensing of radiation emitted from the backside of susceptor 126 or the substrate 125. The pyrometer reading is then converted to temperature based on the surface emissivity of the susceptor or substrate. The pyrometer 136 emits a focal beam 138 directed through the lower dome 130 and through the susceptor support shaft 127. The pyrometer 136 measures the temperature of the susceptor 126 (for example, when the susceptor 126 is formed from silicon carbide) or the temperature of the substrate 125 (for example, when the susceptor 126 is formed from quartz or when a susceptor is absent and the substrate 125 is supported in another manner, such as by a ring). It is to be noted that lift pin contacts 142 are generally positioned adjacent to the focal beam 138, and do not rotate, and thus, do not interfere with the pyrometer focal beam 138 during processing.

The preheat ring 123 is removably disposed on a lower liner 140 that is coupled to the chamber body 102. The preheat ring 123 is disposed around the internal volume of the chamber body 102 and circumscribes the substrate 125 while the substrate 125 is in a processing position. During processing, the preheat ring 123 is heated by the lamps 135. The preheat ring 123 facilitates preheating of a process gas as the process gas enters the chamber body 102 through a plenum 120 adjacent to the preheat ring 123.

The central window portion 115 of the upper dome 116 and the bottom portion 117 of the lower dome 130 may be formed from an optically transparent material such as quartz to direct radiations from the lamps without significant absorption. The peripheral flange 119 of the upper dome 116, which engages the central window portion around a circumference of the central window portion, the peripheral flange 121 of the lower dome 130, which engages the bottom portion around a circumference of the bottom portion, may all be formed from an opaque quartz to protect the O-rings 122 proximity to the peripheral flanges from being directly exposed to the heat radiation.

In some cases, the entire upper dome 116, including the peripheral flange 119, may all be formed of an optically transparent material such as quartz. In certain examples, both the upper and lower domes 116, 130 and respective peripheral flanges 119, 121 may all be formed of optically transparent material such as quartz. Having the peripheral flanges 119, 121 made optically transparent may be advantageous. Epitaxial deposition is a complex process of laying down atoms such as Si, Ge or dopants on a substrate surface to create a single crystalline layer. The very nature of the upper and lower dome constructions may incur a high thermal temperature gradient from the edge of the domes to the peripheral flanges if clear quartz domes and opaque peripheral flanges were used. This is because at elevated deposition temperatures, the dome temperature may raise up to about 342° C. over the substrate while the area near the peripheral flange may drop off by about 100° C. and rapidly decreases from such area, which causes appreciable deposition particles and is undesirable for epitaxy processes that demand very tight temperature controls.

An all-clear dome provides for thermal uniformity within a delta of 10° C. for the dome/flange in the area of chamber gases. By constructing the upper and lower domes out of all clear quartz, the thermal conductivity of the quartz is quite high, resulting in a very uniform temperature profile across the surface. For example, it has been observed that at elevated deposition temperatures, a dome temperature of 342° C. was measured at the center while 335° C. measured at the inner edge of the peripheral flange. Thermal transient stabilization times is therefore greatly improved by 2-3× due to the improved conductance. This will allow for better process control for ZII/V as well as SiGe and SiC applications, among others.

The support system 104 includes components used to execute and monitor pre-determined processes, such as the growth of epitaxial films in the processing chamber 100. The support system 104 includes one or more of gas panels, gas distribution conduits, vacuum and exhaust sub-systems, power supplies, and process control instruments. A controller 106 is coupled to the support system 104 and is adapted to control the processing chamber 100 and support system 104. The controller 106 includes a central processing unit (CPU), a memory, and support circuits. Instructions resident in controller 106 may be executed to control the operation of the processing chamber 100. Processing chamber 100 is adapted to perform one or more film formation or deposition processes therein. For example, a silicon carbide epitaxial growth process may be performed within processing chamber 100. It is contemplated that other processes may be performed within processing chamber 100.

FIG. 1B is a cross-sectional view of a thermal processing chamber 100 according to another embodiment of the invention. FIG. 1B is substantially identical to FIG. 1A, except that a reflector 155 is disposed above the top dome 116. The reflector 155 may have a cylindrical shape body 156 with a top portion 157 flared out from an outer circumference of the body 156. The top portion 157 may have threaded features at outside surface to help break and/or redirect energy radiation from the lamps 135 at the center of the processing chamber 100. The threaded features may facilitate in redistributing energy radiation across the susceptor 126 or substrate 125 for optimum thickness uniformity of epitaxy process. FIG. 1C is a perspective view of the reflector 155 showing the top portion 157 with threaded features 159 running around the entire circumference of the top portion 157 or at any desired location of the cylindrical shape body of the reflector 155. In some embodiments, the threaded features 159 may extend intermittently at any desired level around the circumference of the top portion 157 or the cylindrical shape body of the reflector 155. The reflector 155 may have one or more openings 161 (only one is partially shown) at the bottom of the reflector 155 to allow one or more pyrometer focal beams from pyrometers to pass through. The pyrometers may be positioned above the reflector 155. In one example, the bottom of the reflector 155 has three openings arranged at positions corresponding to the locations of the pyrometers. More or less openings are contemplated depending upon the number of the pyrometers.

Figure 2:
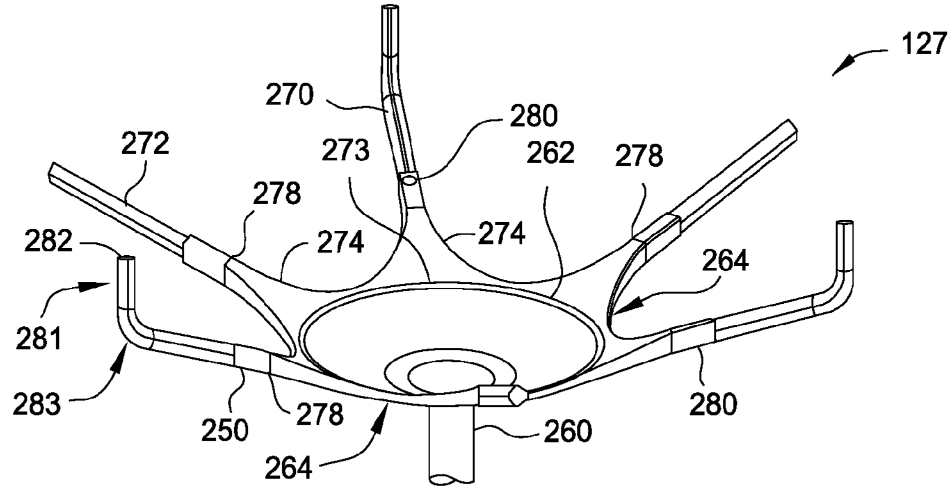
FIG. 2 illustrates a perspective view of a susceptor support shaft, according to an embodiment of the invention.

FIG. 2 illustrates a perspective view of the susceptor support shaft 127 according to one embodiment of the invention. The susceptor support shaft 127 includes a shaft 260 having a cylindrical shape and coupled to a support body 264. The shaft 260 can be bolted, threaded, or connected in another manner to the support body 264. The support body 264 includes a solid disc 262 and a plurality of tapered bases 274 extending from an outer circumference 273 of the solid disc 262. The solid disc 262 may have a conical shape, or any desired shape with a surface area that is capable of covering the pyrometer temperature reading path. In one example, at least three support arms 270 extend from some of the tapered bases 274, and at least three dummy arms 272 extending from some of the tapered bases 274. The tapered bases 274 facilitate connection of the support arms 270 and dummy arms 272 to the solid disc 262.

The support arms 270 may include an opening 280 formed therethrough. The opening 280 may be located adjacent to a connecting surface 278 that connects to one of the tapered bases 274. The opening 280 allows the passage of a lift pin therethrough. A distal end 281 of a support arm 270 may also include an opening 282 for accepting a pin 137 (shown in FIG. 1A). The openings 280 and 282 are generally parallel to one another, and also, are generally parallel to the shaft 260. Each support arm 270 may include an elbow 283 bending upward for orienting the opening 282 to accept the pin 137 (shown in FIG. 1A). In one embodiment, the elbow 283 forms an obtuse angle. The support arms 270 are spaced at even intervals around the outer circumference 273 of the solid disc 262. In the embodiment shown in FIG. 2, the support arms 270 are spaced about 120 degrees form one another.

The support body 264 may also include a plurality of dummy arms 272. Each dummy arm is coupled to a tapered base 274 and extends linearly therefrom. The dummy arms 272 are spaced at equal intervals from one another, for example, about 120 degrees. In the embodiment shown in FIG. 2, the dummy arms 272 are located above 60 degrees from each of the support arms 270 and alternate therewith around the solid disc 262. The dummy arms 272 generally do not contact or otherwise support a susceptor. The dummy arms facilitate even temperature distribution of a substrate during processing when the shaft is rotating.

During processing, the susceptor support shaft 127 absorbs thermal energy from lamps utilized to heat a susceptor and/or substrate. The absorbed heat radiates from the susceptor support shaft 127. The radiated heat radiated by the susceptor support shaft 127, particularly the support arms 270, is absorbed by the susceptor and/or substrate. Because of the relatively close position of the support arms 270 to the susceptor or substrate, heat is easily radiated to the susceptor or support shaft causing areas of increased temperature adjacent to the support arms 270. However, utilization of the dummy arms 270 facilitates a more uniform radiation of heat from the susceptor support shaft 270 to the susceptor and/or substrate, and thus, the occurrence of hot spots is reduced. For example, the utilization of dummy arms 272 results in a uniform radiation of a susceptor, rather than three local hot spots adjacent the support arms 272.

Additionally, the absence of a supporting ring adjacent to a susceptor, as is used in some prior approaches, increases thermal uniformity across a substrate. The susceptor support shaft 127 does not include an annular ring coupling the terminal ends of the susceptor support shaft, thus improving thermal uniformity. The utilization of such a ring can result in an increased temperature gradient adjacent to the ring (e.g., near the perimeter of the susceptor). Moreover, the absence of material from between the support arms 270 and the dummy arms 272 reduces the mass of the susceptor support shaft 127. The reduced mass thus facilitates rotation of the susceptor support shaft 127, and also reduces the amount of undesirable thermal radiation from the susceptor support shaft 127 to a susceptor (e.g., due to a reduction in thermal mass). The reduced mass of the susceptor support shaft 127 also assists in achieving faster ramp up and cool down on substrate. The faster ramp up and cool down facilitates increased throughput and productivity.

FIG. 2 illustrates one embodiment; however, additional embodiments are also contemplated. In another embodiment, it is contemplated that the solid disc 262, the support arms 272, and the dummy arms 274 may be formed form a unified piece of material, such as quartz, rather than individual components. In another embodiment, it is contemplated that the number of support arms 270 may be increased. For example, about, four or six support arms 270 may be utilized. In another embodiment, it is contemplated that the number of dummy arms 274 may be increased or decreased, and may include zero. In another embodiment, the dummy arms 272 may include an elbow and vertically-directed distal end to facilitate further symmetry with the support arms 270, and thus, provide even more uniform heating of the substrate and susceptor. It is to be noted that embodiments which include elbows on the dummy arms 272, or embodiments that include additional dummy arms 272 or support arms 270, may undesirably result in increased thermal mass. In another embodiment, the solid disc 262 may be semi-spherical or a section of a sphere cut by a plane.

Figure 3:
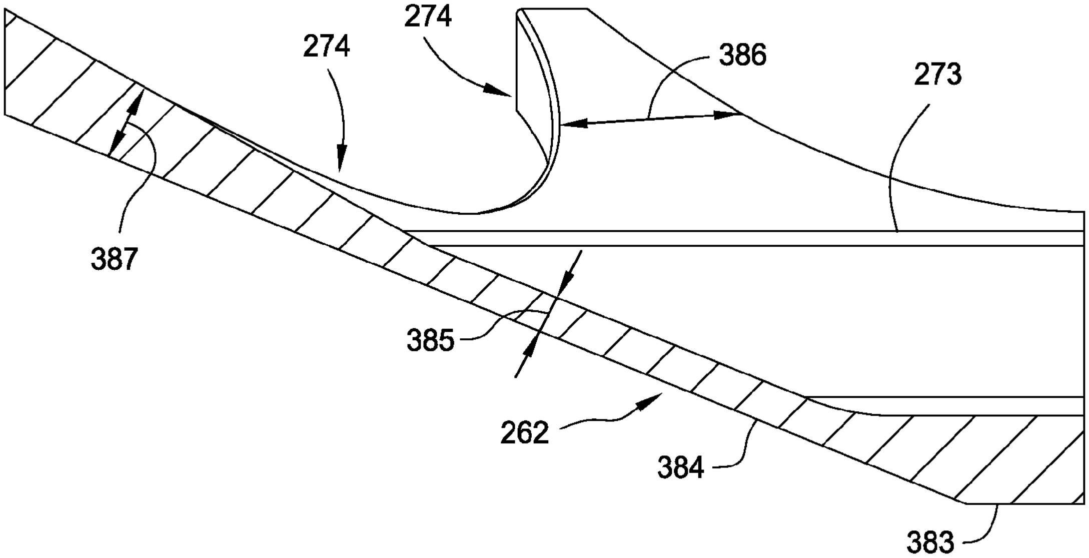
FIG. 3 illustrates a partial sectional view of a support body, according to one embodiment of the invention.

FIG. 3 illustrates a partial sectional view of a support body 264, according to one embodiment of the invention. The solid disc 262 may include an apex 383 having a first thickness. The apex 383 is adapted to couple with a shaft, such as the shaft 160 shown in FIG. 1A. The solid disc 262 additionally includes a sidewall 384 having a second thickness 385 less than the first thickness of the apex 383. The relatively reduced thickness reduces the thermal mass of the support body 264, thus facilitating more uniform heating during processing. The second thickness 385 may be a substantially constant thickness, although a varying thickness 385 is contemplated. The sidewall 384 of the solid disc 262 generally has a surface area that is sufficiently to cover the pyrometer temperature reading path. Therefore, the sidewall 384 allows the passage of a pyrometer focal beam 138 (shown in FIG. 1A) therethrough. As the susceptor support shaft 127 rotates during the processing, the pyrometer focal beam 138 constantly passes through the sidewall 384. Although the sidewall 384 is disposed within the path of a pyrometer focal beam, the path remains constant even as the support shaft 127 rotates. Therefore, the amount of pyrometer focal beam passing through the support shaft 127 to a susceptor is consistent. Thus, temperature measurement using the pyrometer focal beam 138 can be accurately determined through 360 degrees of rotation of the support shaft 127.

The solid disc 262 may have a surface area (one side) that is less than the surface area (one side) of the substrate. For example, the solid disc 262 may have a surface area that is about 90% less, about 80% less, about 70% less, about 60% less, about 50% less, about 40% less, about 30% less, about 20% less, or about 10% less than that of the substrate. In one example, the solid disc 262 has a surface area (one side) about 30% to 80% less than the surface area (one side) of the substrate. In one example, the solid disc 262 may have a radius of about 60 millimeters to ensure passage of a pyrometer focal beam therethrough. In such an embodiment, the pyrometer focal beam passes through the sidewall 384, which has a substantially constant thickness.

In contrast, prior known susceptor supports had arms which interrupted the pyrometer focal beam. Thus, when the susceptor support rotates, the beam would experience areas of differing transmission path (e.g., either through a susceptor support arm, or adjacent thereto). The differing path of prior methods resulted in periods of inaccurate temperature measurement, because it is difficult to accurately calibrate a pyrometer for use through transmissions of different mediums. In contrast, the susceptor support shaft 127 facilitates a consistent path of the pyrometer focal beam transmission, and thus, the accuracy of temperature measurement using the pyrometer focal beam 138 is increased.

The support body 264 also includes a plurality of tapered bases 274 extending from the outer circumference 273 the solid disc 262. As the width 386 of the tapered bases 274 decreases (e.g., as the tapered bases 274 extend outward from the solid disc 262), the height or thickness 387 of the tapered bases increases. The increase in the thickness 387 of the tapered base compensates for a reduced structural strength of the tapered base attributable to the decreasing width 386. Additionally, a similar bending moment of inertial is maintained. In one example, the thickness 385 is about 3 millimeters to about 5 millimeters, such as about 3.5 millimeters. The thickness 387 may be within a range of about 3 millimeters to about 12 millimeters. It is contemplated that the thicknesses 387 and 385 may be adjusted as desired.

Figure 4A:
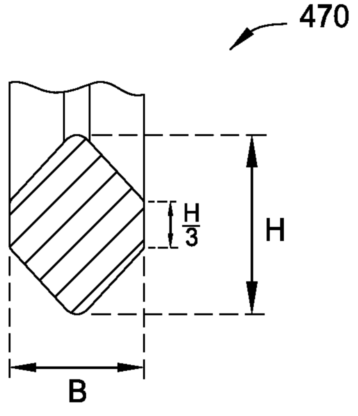
FIGS. 4A-4E illustrate sectional views of support arms, according to embodiments of the invention.

FIGS. 4A-4E illustrate sectional views of support arms, according to embodiments of the invention. FIG. 4A illustrates a cross sectional view of a support arm 270. The cross section is hexagonal. The relative dimensions of the support arm 270 maximize the moment of inertia of the support arm 270 while minimizing the area (and thus the mass) of the support arm 270. In one example, the base B may be about 8 millimeters, while the height H may be about 9.5 millimeters. It is to be noted that the connecting surface 278 of the support arm 270 has a rectangular cross section to facilitate coupling of the support arm 270 to a tapered base.

Figure 4B:
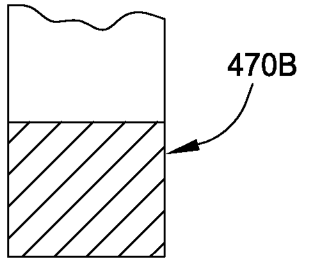
Figure 4C:
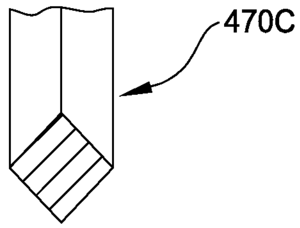
Figure 4D:
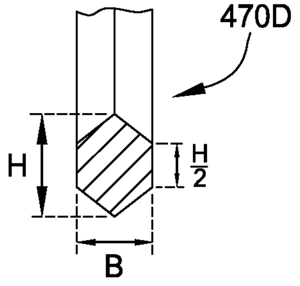
Figure 4E:
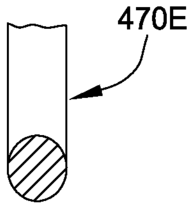

FIGS. 4B-4E illustrate additional sectional views of support arms, according to other embodiments. FIG. 4B illustrates a sectional view of a support arm 270B. The support arm 270B has a rectangular cross section. FIG. 4C illustrates a sectional view of a support arm 270C. The support arm 270C has a diamond-shaped cross section. FIG. 4D illustrates a sectional view of a support arm 270D. The support arm 270D has a hexagonal cross section of different relative dimensions than the cross section shown in FIG. 4A. FIG. 4E illustrates a sectional view of a support arm 270E. The support arm 270E has a circular cross section. Support arms having other shapes, including polygonal cross sections, are further contemplated.

Figure 5A:
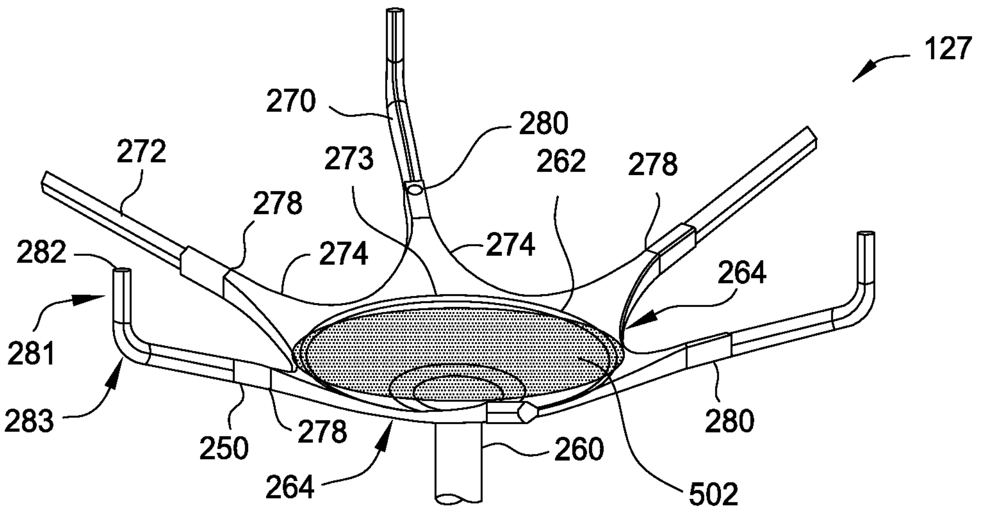
FIG. 5A illustrate a perspective view of the susceptor support shaft according to another embodiment of the invention.
Figure 5B:
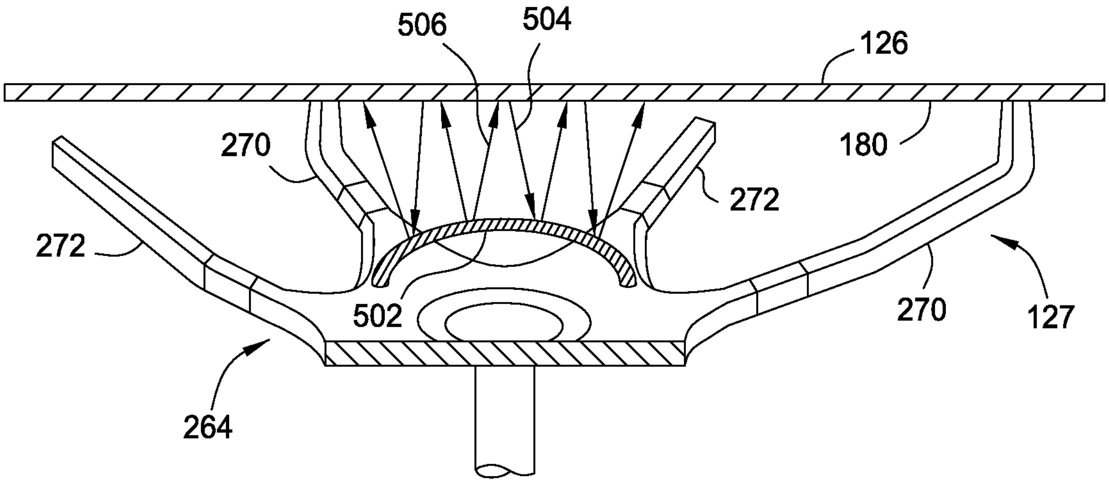
FIG. 5B illustrate a perspective cross-sectional view of the susceptor support shaft with a refractive element positioned thereon.

FIG. 5A illustrate a perspective view of the susceptor support shaft 127 according to embodiments of the invention. The susceptor support shaft 127 is substantially identical to the susceptor support shaft 127 shown in FIG. 2, except that an optical refractive element 502 is additionally positioned on the top of the solid disc 262. The refractive element 502 is adapted to redistribute the heat/light radiations across the backside of the susceptor 126 (FIG. 1A) for optimum thickness uniformity of epitaxy process. FIG. 5B illustrate a perspective cross-sectional view of the susceptor support shaft 127 with the refractive element 502 sitting thereon. FIG. 5B also shows simulated secondary heat radiations between the susceptor 126 and the refractive element 502.

The refractive element 502 is sized to substantially match the circumference of the solid disc 262 so that the refractive element 502 is fully supported and securely positioned on the solid disc 262 without movement while the susceptor support shaft 127 is rotated during the process. The refractive element 502 may have any desired dimension. The refractive element 502 may be configured to sufficiently cover the pyrometer temperature reading path to avoid any possible interference of pyrometer readings. The refractive element 502 can be replaced for maintenance. The refractive element 502 may be a simple add-on to any susceptor support shafts using multiple arms. In various examples, the refractive element 502 may be formed of clear quartz or any suitable material such as glass or transparent plastic.

Referring to FIG. 5B, the refractive element 502 may have a convex surface on a first side (facing the susceptor) to deflect secondary heat radiation 506 away from the center area of a susceptor, such as the susceptor 126 of FIG. 1A. The second side (facing away the susceptor) of the refractive element 502 may be concave or near flat. While a convex-concave refractive element 502 is shown, a plano-convex refractive element (i.e., one surface is convex and the other surface is flat), a concave-convex refractive element, or any other optical element that is optically equivalent to the convex-concave refractive element as shown may also be used. The refractive element 502 may have a constant thickness or a thickness with different cross section to provide independent tuning knob to manipulate the heat distribution on the backside of the susceptor 126. It is contemplated that the refractive element 502 may be formed as a desired lens to facilitate collimation and homogenization of radiant energy emitted from lamps.

During the process, the heat radiation from the lamps (e.g., lamps 135 of FIG. 1A) hits the backside 180 of the susceptor 126 and reflects back (shown as heat radiations 504) by the susceptor 126 to the refractive element 502. The convex surface of the refractive element 502 then deflects these secondary heat radiations back to the susceptor 126. These secondary heat radiations bounce back and forth between the susceptor 126 and the refractive element 502, with some radiations passing through the refractive element 502. The reflecting angle of secondary heat radiations can vary at different radius of the convex surface depending upon the profile of the refractive element. In the embodiment as shown, some of the secondary heat radiations will deflect away from the center area of the susceptor 126 due to the convex surface of the refractive element 502. Deflecting some secondary heat radiations 506 away from the center area of the susceptor 126 may be advantageous since the center area above the solid disc 262 may suffer from excessive heat due to the conical or bowl shape of the solid disc 262, which reflects a majority of secondary radiations towards the center area of the susceptor 126. With the help of the refractive element 502, the secondary heat radiations can be redistributed across susceptor 126 and the substrate. As a result, a more uniform heat profile on the substrates is obtained. The uniform heat profile on the substrates results in a desired deposition thickness of epitaxy process, which in turn, results in high quality and more efficient manufactured devices.

The convex surface of the refractive element 502 may have a desired radius of curvature of, for example, about 200 mm to about 1200 mm, plus or minus 300 mm. The concave surface of the refractive element 502 may have the same or different radius of curvature as that of the convex surface. The radius of curvature of the refractive element may vary depending upon the susceptor and/or the substrate. The diameter and/or radius of curvature of the convex surface of the refractive element 502, or even the shape and diameter of the solid disc 262, or their combinations, may be independently adjusted to manipulate the heat distribution for effective heating of the entire substrate, or the specific radius zone on the substrate.

Benefits of the invention generally include more accurate temperature measurement of susceptors and substrates during processing, particularly when using a rotating susceptor support shaft. The susceptor support shafts of the present invention facilitate consistent pyrometer beam transmission as the susceptor support shaft rotates. Thus, temperature measurement variations attributed to a change in transmission path of the pyrometer beam are reduced. Moreover, the reduced mass of the disclosed susceptor support improves substrate temperature uniformity and enhances process ramp up and ramp down times.

While the foregoing is directed to embodiments of the present invention, other and further embodiments of the invention may be devised without departing from the basic scope thereof, and the scope thereof is determined by the claims that follow.

We claim:

1. A susceptor support shaft for a process chamber, comprising:
- a support shaft; and
- a support body coupled to the support shaft, the support body comprising:
  - a solid disc;
  - a plurality of bases extending outwardly from the solid disc;
  - at least three support arms extending from some of the plurality of bases, wherein each of the support arms includes an elbow bending upward to a distal end of the support arm; and
  - at least three dummy arms extending from some of the plurality of bases, wherein each of the dummy arms is a linear arm.

2. The susceptor support shaft of claim 1, wherein the support arms are spaced at equal intervals from one another.

3. The susceptor support shaft of claim 1, wherein a thickness of each of the bases increases as a width of each of the bases decreases.

4. The susceptor support shaft of claim 1, wherein each of the support arms includes an opening therethrough for accepting a lift pin.

5. The susceptor support shaft of claim 1, further comprising:
- a refractive lens removably positioned on the solid disc, wherein the refractive lens is formed of a light transparent material.

6. The susceptor support shaft of claim 5, wherein the refractive lens has a constant thickness, and the refractive lens has a convex or concave surface on a first side and convex or concave surface on a second side opposing the first side.

7. The susceptor support shaft of claim 6, wherein the concave surface of the refractive lens has a radius of curvature of about 200 mm to about 1200 mm.

8. A process chamber for heating a substrate, comprising:
- a substrate support disposed within the process chamber;
- a lower dome disposed below the substrate support;

an upper dome disposed opposing the lower dome, the upper dome comprising:

a central window portion; and a peripheral flange engaging the central window portion around a circumference of the central window portion, wherein the central window portion and the peripheral flange are formed of a light transparent material; and a support shaft coupled to the substrate support, comprising:

a shaft; and a support body coupled to the shaft, the support body comprising:

a solid disc;

a plurality of bases extending outwardly from the solid disc;

a plurality of support arms extending from some of the plurality of bases, wherein each of the support arms includes an elbow bending upward to a distal end of the support arm; and a plurality of dummy arms extending from some of the plurality of bases, wherein each of the dummy arms is a linear arm.

9. The process chamber of claim 8, wherein the solid disc has a surface area (one side) about 30% to 80% less than the surface area (one side) of the substrate.

10. The process chamber of claim 8, wherein the support shaft further comprises:

a refractive lens removably positioned on the solid disc, wherein the refractive lens is formed of clear quartz, glass or transparent plastic, and wherein the refractive lens is sized to match an outer circumference of the solid disc.

11. The process chamber of claim 10, wherein the refractive lens has a convex or concave surface on a first side facing a backside of the substrate support, and wherein the refractive lens has a convex or concave surface on a second side facing away the backside of the substrate support.

12. The process chamber of claim 8, further comprising:

a reflector disposed above the upper dome, the reflector has one or more threaded features on its outside surface, and the one or more threaded features extend around a circumference of the reflector.

13. A susceptor support shaft for a process chamber, comprising:

a support shaft;

a support body coupled the support shaft, the support body comprising:

a solid disc;

a plurality of bases extending outwardly at even intervals from an outer circumference of the solid disc;

a plurality of support arms extending from some of the plurality of bases, wherein each of the support arms includes an elbow bending upward to a distal end of the support arm; and a plurality of dummy arms extending from some of the plurality of bases, wherein each of the dummy arms is a linear arm; and a refractive lens removably supported by the solid disc and sized to match a circumference of the solid disc.

14. The susceptor support shaft of claim 13, wherein the plurality of support arms are spaced at equal intervals from one another.

15. The susceptor support shaft of claim 14, wherein the plurality of dummy arms are spaced at equal intervals from one another, and the at least three support arms and the at least three dummy arms are alternately located around the solid disc.

16. The susceptor support shaft of claim 13, wherein the refractive lens has a convex or concave surface on a first side and convex or concave surface on a second side opposing the first side.

17. The susceptor support shaft of claim 16, wherein the concave surface of the refractive lens has a radius of curvature of about 200 mm to about 1200 mm.

* * * * *